(12) United States Patent
Shimizu et al.

(10) Patent No.: US 7,405,451 B2
(45) Date of Patent: Jul. 29, 2008

(54) SEMICONDUCTOR DEVICE INCLUDING MIS TRANSISTORS

(75) Inventors: Tatsuo Shimizu, Tokyo (JP); Takeshi Yamaguchi, Kanagawa-Ken (JP); Yukie Nishikawa, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/020,275

(22) Filed: Dec. 27, 2004

(65) Prior Publication Data

US 2005/0139926 A1 Jun. 30, 2005

(30) Foreign Application Priority Data

Dec. 26, 2003 (JP) ............................. 2003-432199

(51) Int. Cl.
*H01L 21/8234* (2006.01)
(52) U.S. Cl. ........................ 257/407; 438/275
(58) Field of Classification Search ................ 257/407, 257/402, 412, 413, 225, 226, 288; 438/217, 438/289, 585, 587, 588, 592, 48, 49, 54, 438/197, 199, 275
See application file for complete search history.

(56) References Cited

U.S. PATENT DOCUMENTS

| | | | | |
|---|---|---|---|---|
| 3,491,014 A * | 1/1970 | Giuseppe et al. | ............ | 204/242 |
| 5,986,301 A * | 11/1999 | Fukushima et al. | ......... | 257/306 |
| 6,458,695 B1 | 10/2002 | Lin et al. | | |
| 6,677,652 B2 * | 1/2004 | Lin et al. | ..................... | 257/407 |
| 6,743,292 B2 * | 6/2004 | Jia et al. | ..................... | 117/108 |
| 6,794,234 B2 * | 9/2004 | Polishchuk et al. | ......... | 438/199 |
| 6,797,413 B2 * | 9/2004 | Takeishi et al. | ............. | 428/690 |
| 6,818,347 B1 * | 11/2004 | Jin et al. | ..................... | 429/206 |
| 7,042,043 B2 * | 5/2006 | Forbes et al. | ................ | 257/314 |

FOREIGN PATENT DOCUMENTS

| | | |
|---|---|---|
| JP | 2002-237589 | 8/2002 |
| JP | 2002-289844 | 10/2002 |
| JP | 2003/273350 | 9/2003 |

OTHER PUBLICATIONS

Polishchuk et al.; "Dual Work Function CMOS Gate Technology Based on Metal Interdiffusion", Materials Research Society Symposium Proceeding, vol. 670, pp. K5.1.1-K5.1.6, (2001).

(Continued)

*Primary Examiner*—Thao X. Le
*Assistant Examiner*—Ajay K Arora
(74) *Attorney, Agent, or Firm*—Finnegan, Henderson, Farabow, Garrett & Dunner, L.L.P.

(57) ABSTRACT

The present invention is to obtain an MIS transistor which allows considerable reduction in threshold fluctuation for each transistor and has a low threshold voltage. First gate electrode material for nMIS and second gate electrode material for pMIS can be mutually converted to each other, so that a process can be simplified. Such a fact that a dependency of a work function on a doping amount is small is first disclosed, so that fluctuation in threshold voltage for each transistor hardly occurs.

4 Claims, 5 Drawing Sheets

OTHER PUBLICATIONS

Claflin et al.; "High-κ Dielectrics and Dual Metal Gates: Integration Issues for New CMOS Materials", Materials Research Society Symposium Proceeding, vol. 567, pp. 603-609, (1999).

Notification of Reason for Rejection mailed on Jul. 13, 2007, in counterpart Japanese Application No. 432199/2003.

Notification of Reason for Rejection issued by the Japanese Patent Office on Oct. 16, 2007, for Japanese Patent Application No. 2003-432199, and English-language translation thereof.

* cited by examiner

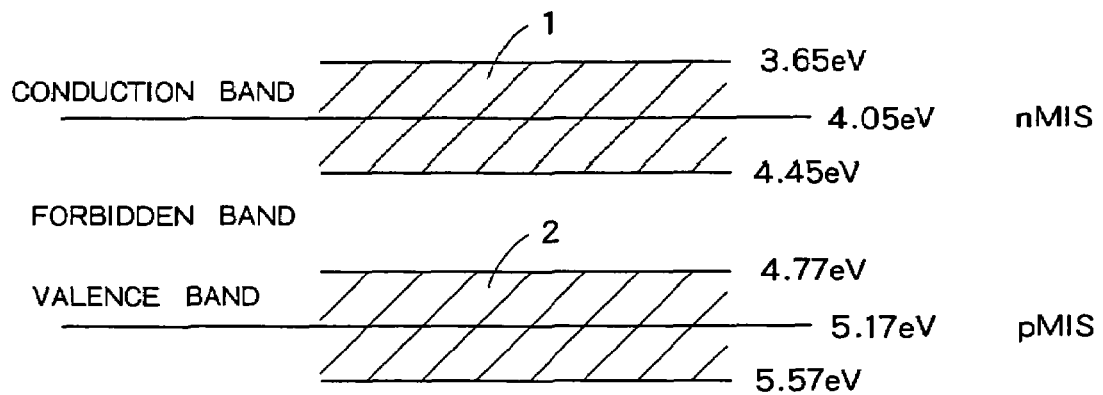
F I G. 1
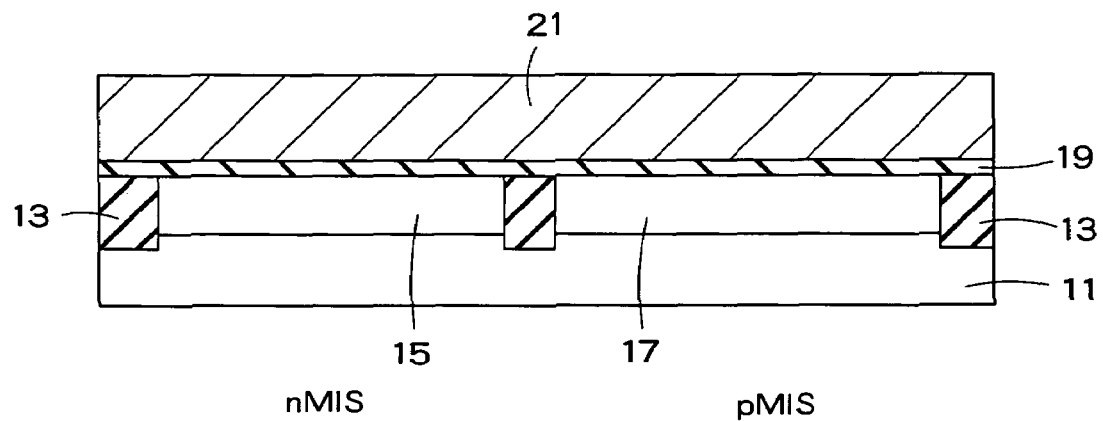
F I G. 2
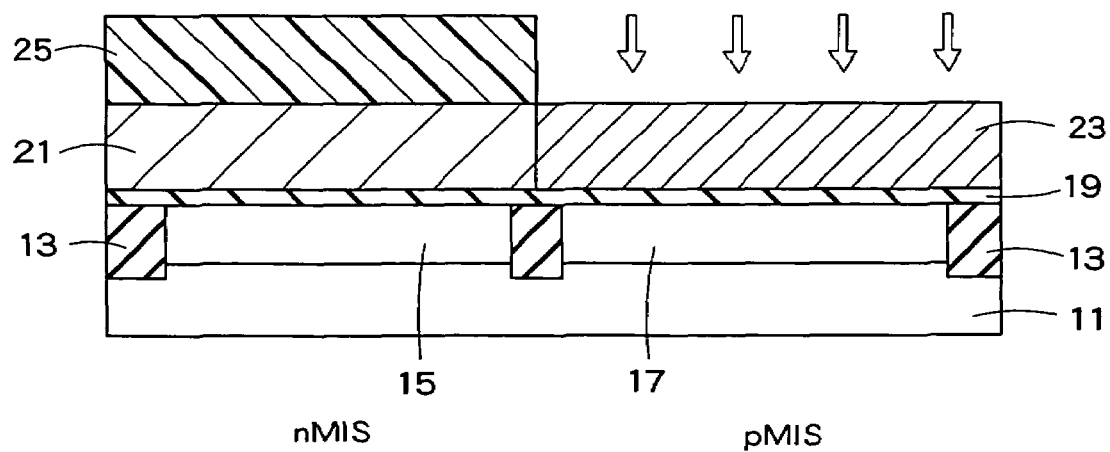
F I G. 3

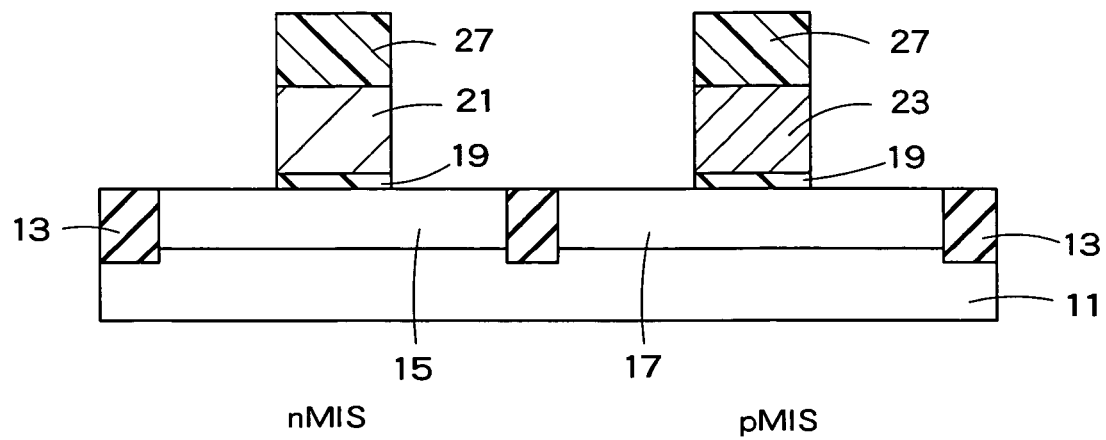
F I G. 4
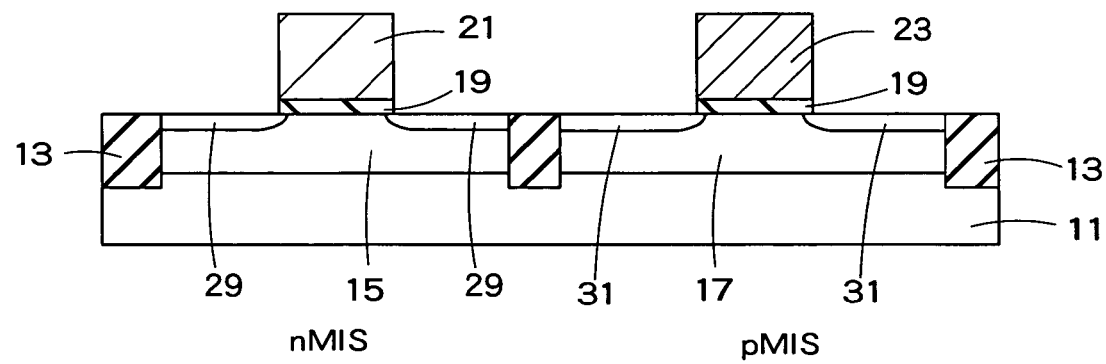
F I G. 5
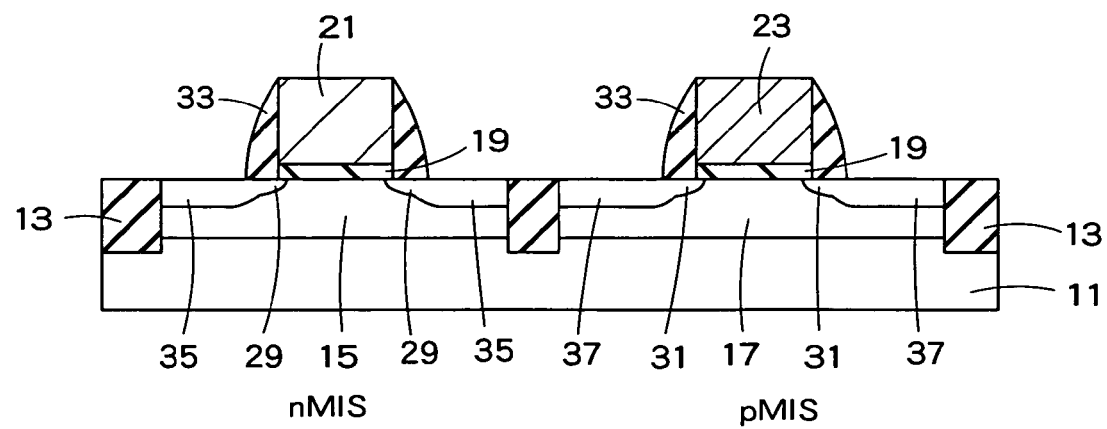
F I G. 6

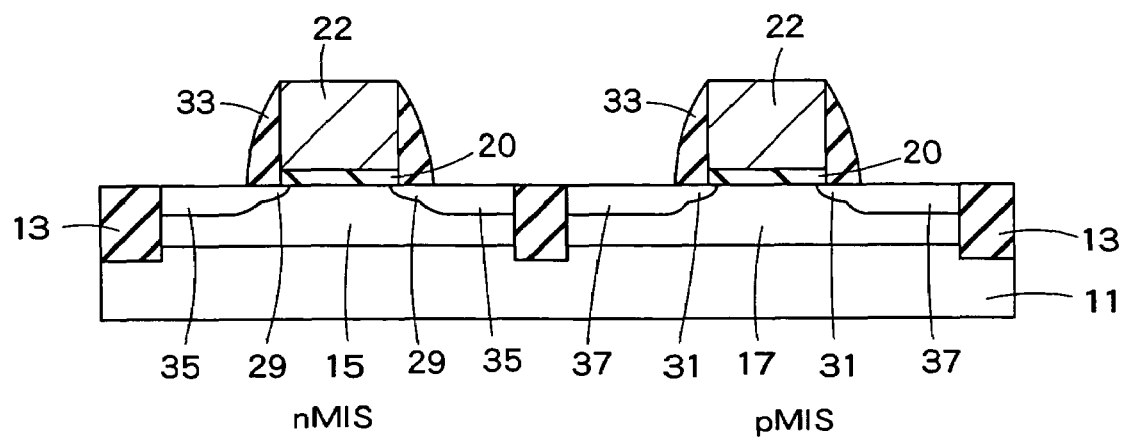
F I G. 10
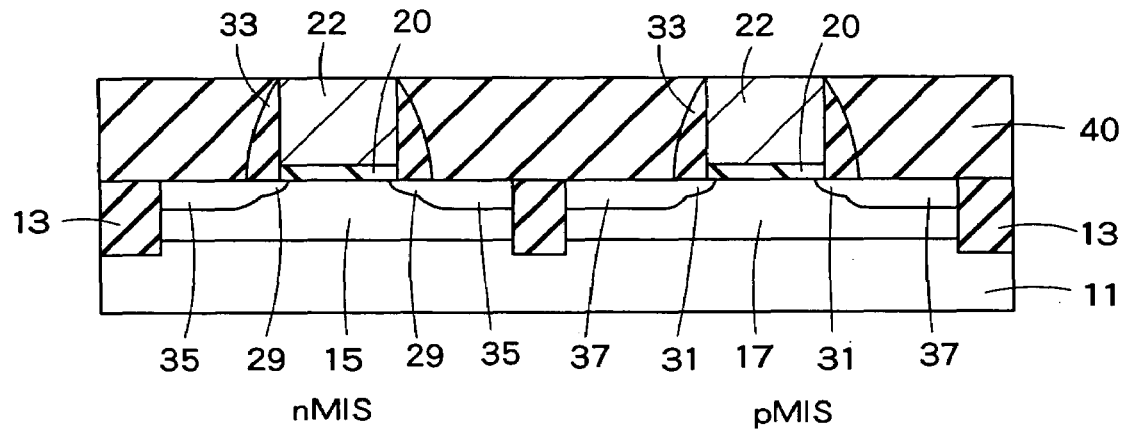
F I G. 11
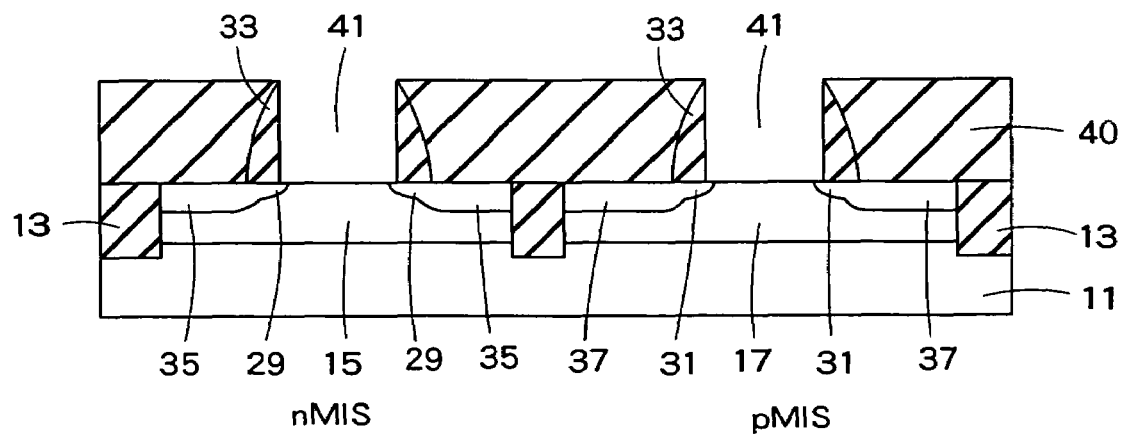
F I G. 12

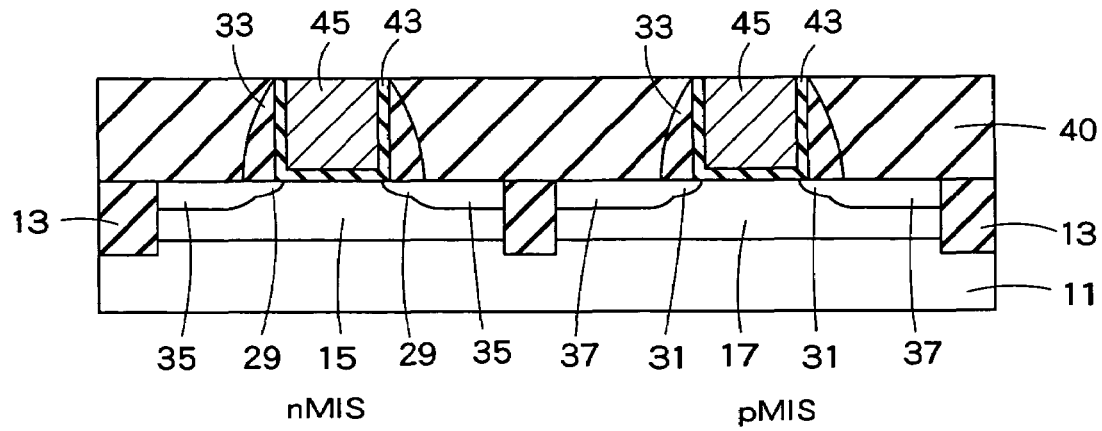
F I G. 13
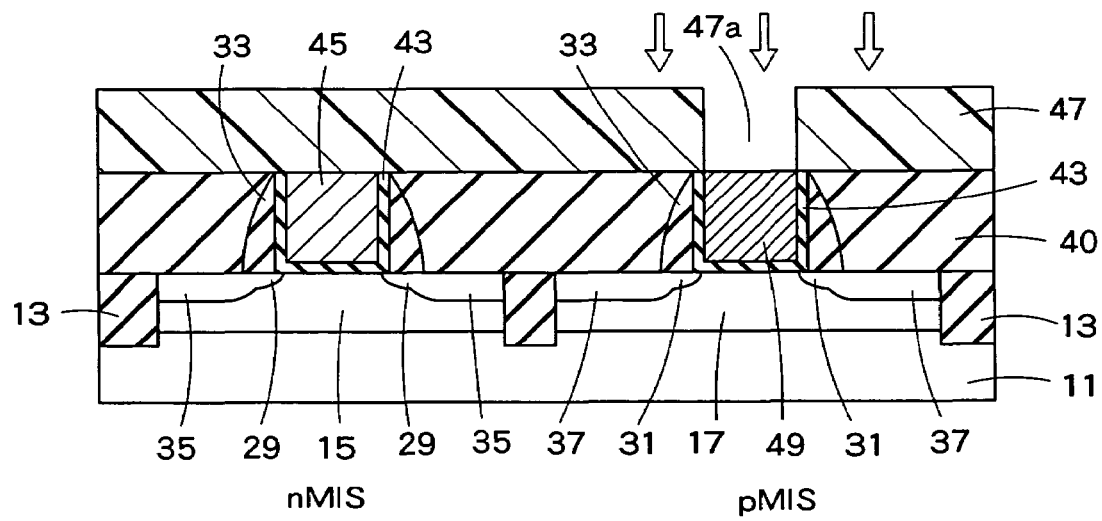
F I G. 14
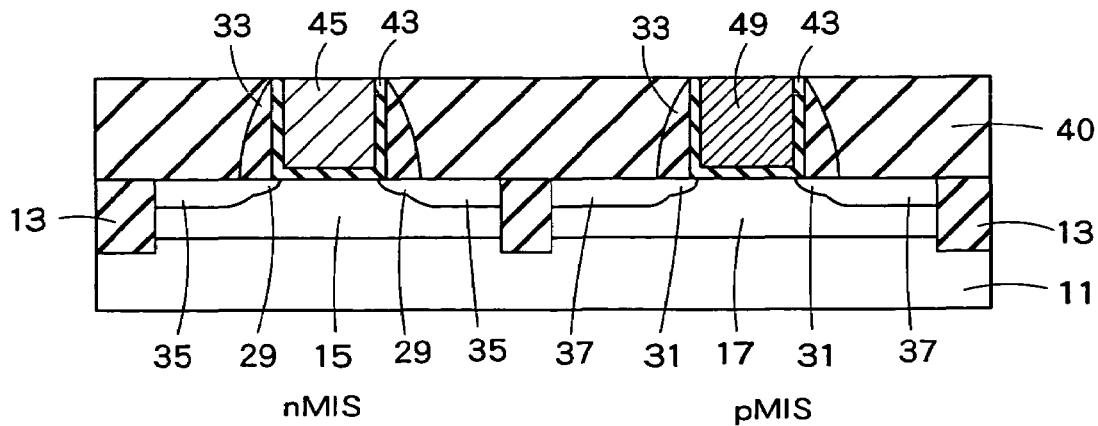
F I G. 15

SEMICONDUCTOR DEVICE INCLUDING MIS TRANSISTORS

CROSS-REFERENCE TO RELATED APPLICATION

This application is based upon and claims the benefit of priority from prior Japanese Patent Application No. 2003-432199 filed on Dec. 26, 2003 in Japan, the entire contents of which are incorporated herein by reference.

BACKGROUND OF THE INVENTION

1. Field of the Invention

The present invention relates to a semiconductor device and a method for manufacturing the same, and in particular to a gate electrode using electrically conductive oxide, of an n-type MIS transistor and a p-type MIS transistor.

2. Related Art

A gate electrode a conventional MISFET (Metal Insulator Semiconductor Field Effect Transistor)(hereinafter, called "MIS transistor") is formed of polycrystal silicon. Because of demand for reducing power consumption, it is common to employ a dual gate structure where n-type polycrystal silicon is used for a gate electrode of an n-type MIS transistor (hereinafter, called "nMIS transistor") and p-type polycrystal silicon is used for a gate electrode of a p-type MIS transistor (hereinafter, called "pMIS transistor").

In the dual gate structure, there is a problem about "boron punch through" where boron contained in the p-type polycrystal silicon diffuses into a silicon substrate through a gate insulating film. Further, since the polycrystal silicon produces a depletion layer in an interface between the same and the gate insulating film, a film thickness of the gate insulating film equivalent to an $SiO_2$ film becomes thicker in an amount of about 0.5 nm. In current situation where development is directed for achieving the $SiO_2$ equivalent film thickness of the gate insulating film of 1 nm or less for fineness of a device by such a scheme as advance of film thinning of the gate insulating film or use of a high-k dielectric film in some cases, increase of the above equivalent film thickness causes a much significant problem.

As a method for solving the problem occurring when such polycrystal silicon is used for the gate electrode, it is considered that high melting point metal is used as material for the gate electrode. Since it is unnecessary to introduce boron into the metal gate electrode, the problem about the "boron punch through" does not occur. Since a depletion layer itself is not produced, such a problem that the conversion film thickness becomes larger at an electrode portion is also solved. It is considered that a problem about shift of flat band potential Vfb causing a problem in high-k dielectric HfSiON or the like can be solved by using the metal gate electrode. This is because one of serious causes of shift of the Vfb fluctuated is solved, since a charge trap due to boron disappears.

On the other hand, when gate electrodes for the pMIS and the nMIS are formed in a usual manner using the same metal gate electrode material, there occurs such a problem that a threshold voltage is increased as compared with that of the polycrystal silicon gate electrode. For example, when promising titanium nitride is used as the gate electrode material, it is difficult to lower the threshold voltage down to 0.4V or less, even if an impurity distribution in a surface of the silicon substrate is adjusted. The reason is why, since the work function of titanium nitride is about 4.7 eV and the value is positioned in the vicinity of an central portion of the forbidden band of silicon, a different in work function between the titanium nitride and the pMIS transistor reaches about 0.47 eV and a difference in work function between the titanium nitride and the nMIS transistor reaches about 0.65 eV.

In view of these circumstances, first, such a thought is proposed that the gate electrode of the pMIS transistor and the gate electrode of the nMIS transistor are formed from different kinds of metal materials. For example, this is a thought that iridium or the like which is positioned near an upper limit in the valence band of silicon and whose work function is about 5.2 eV is used as the gate electrode of the pMIS transistor, and zirconium or the like which is positioned near a lower limit of the conduction band of the silicon substrate and whose work function is about 4.1 eV is used as the gate electrode of the nMIS transistor.

1) However, many metals and conductive nitrides themselves are oxidized by bringing them in contact with the gate insulating film which is oxide and an interface property is deteriorated, which causes leakage current. For example, TaN deteriorates at its interface with an insulator in a step conducted at a temperature of 800° C. or higher, which results in increase in leakage current simultaneously with production of oxide. Some oxides develop an insulating property due to material therefor, which results in increase in thickness of the insulating film. For example, in case of Zr, it changes to insulating $ZrO_2$.

2) The metal electrode includes much material with strong catalyst activity. Therefore, there may occur such a serious problem that, when such material, for example, Pt or Ir is used, film peeling-off occurs at another portion (for example, MIM (Metal Insulator Metal) capacitor or the like) in LSI during forming anneal using hydrogen atmosphere.

3) Further, there is a case that a simple metal diffuses in an insulating film or a substrate to distribute unevenly. It is considered that such a metal constitutes a source for destroying insulating property of a gate insulating film. It is to be noted that, when the metal diffuses into the insulating film so as to form metal silicate thereby increasing dielectric constant, properties for an insulating film are improved in some cases. Simultaneously, however, since there is such an indication that electron barrier or hole barrier lowers, the lowering results in slight deterioration in leakage property.

4) Though metal (Ru, Pt, Ir or the like) whose oxide develops electric conductivity is used, the problems described in the above item 2) and 3) still remain. Further, an example where electrically conductive oxide is used for a gate electrode of an nMIS transistor has been known (for example, refer to Japanese Patent Application Laid-open No. 2002-289844 (JP-A)). As described in the next item 5), however, though it is required to select an optimal work function, a combination of these electrically conductive oxides which has work functions suitable for both the nMIS transistor and the pMIS transistor does not exist yet. For example, since the work function of Ru is 4.7 eV and that of $RuO_2$ is in a range of 4.9 to 5.1 eV, an Ru electrode can not be used for the nMIS transistor.

5) Finally, since the work functions must be optimized to the nMIS transistor and pMIS transistor, control based upon nitriding has been tried until now. For example, the work functions of Ti and TiN are respectively 4.1 eV and 4.7 eV, but the work function of TiN is not optimal for the pMIS transistor (for example, refer to Claflin, B; Mater. Res. Soc. Ultrathin $SiO_2$ and High-k Materials for ULSI gate dielectrics 603 (1999)). Further, it is considered that metal post-nitrided is used (Mo, $MO_2N$ or the like). In the case, however, there is an indication about a problem that nitrogen can not be present sufficiently stably, and nitrogen is gone out in a heat treatment.

Thus, there is the present situation that a combination of metals or nitrided metals which have optimal work functions as a combination of the nMIS transistor and the PMIS transistor can not be found. There is a trial based upon alloying. For example, regarding a case of using alloy of Ti—Ni, there is a report that a work function thereof can be controlled from 3.9 eV to 5.3 eV (for example, refer to Polishchuk, I; Mater. Res. Soc. Gate Stack and Silicide Issues in Silicon Processing II Symposium PPK511-6 (2002)). In this case, the problems about metals described in the above items 1), 2), and 3) are not solved to remain as they are.

SUMMARY OF THE INVENION

The present invention has been made in view of the above circumstances, and an object thereof is to provide a semiconductor device provided with a MIS transistor with a low threshold voltage and a method for manufacturing the same.

A semiconductor device according to a first aspect of the present invention includes: an nMIS transistor including a first gate insulating film which is formed on a semiconductor substrate, a first gate electrode which is formed on the first gate insulating film and includes a first electrically conductive oxide film where a work function $\phi m$ (eV) is in a range of $3.65 \leq \phi m \leq 4.45$, and first source-drain regions which are formed on the semiconductor substrate on both sides of the first gate electrode; and a pMIS transistor including a second gate insulating film which is formed on the semiconductor substrate, a second gate electrode which is formed on the second gate insulating film and includes a second electrically conductive oxide film where a work function $\phi m$ (eV) is in a range of $4.77 \leq \phi m \leq 5.57$, and second source-drain regions which are formed on the semiconductor substrate on both sides of the second gate electrode.

A semiconductor device according to a second aspect of the present invention includes: an nMIS transistor, the nMIS transistor comprising a gate insulating film which is formed on a semiconductor substrate, a gate electrode which is formed on the gate insulating film, and source-drain regions which are formed on the semiconductor substrate on both sides of the gate electrode, wherein the gate electrode includes a film formed from Perovskite structure type oxide or oxynitrides of $ABO_3$, the A is constituted of at least one element selected from A1 group and A2 group, the B is constituted of at least one element selected from B1 group and B2 group, and wherein when the A1 group is constituted of alkaline earth metal and rare earth metal, the A2 group is constituted of La and Y, the B1 group is constituted of Ti, Zr, Hf, and Ce, and the B2 group is constituted of Ta, Nb, and V, the film formed from the Perovskite structure oxide or oxynitrides includes at least one element selected from the A2 group and the B2 group.

A semiconductor device according to a third aspect of the present invention includes: an nMIS transistor, the nMIS transistor comprising a gate insulating film which is formed on a semiconductor substrate, a gate electrode which is formed on the gate insulating film, and source-drain regions which are formed on the semiconductor substrate on both sides of the gate electrode, wherein the gate electrode includes a film formed from a rutile structure type oxide or oxynitrides of $AO_2$, and the A includes at least one element selected from A1 group and at least one element selected from A2 group, and wherein the A1 group is constituted of Ti, Zr, Hf, and Ce, the A2 group is constituted of Ta, Nb, and V.

A semiconductor device according to a fourth aspect of the present invention includes: a PMIS transistor, the PMIS transistor comprising a gate insulating film which is formed on a semiconductor substrate, a gate electrode which is formed on the gate insulating film, and source-drain regions which are formed on the semiconductor substrate on both sides of the gate electrode, wherein the gate electrode includes a film formed from Perovskite structure type oxide or oxynitrides of $ABO_3$, the A is constituted of at least one element selected from A1 group and A2 group, the B is constituted of at least one element selected from B1 group and B2 group, and wherein when the A1 group is constituted of alkaline earth metal and rare earth metal, the A2 group is constituted of La and Y, the B1 group is constituted of Ti, Zr, Hf, and Ce, and the B2 group is constituted of W, Mo, Cr, Re, Tc, Mn, Os, Ru, Fe, Ir, Rh, Co, Pt, Pd, and Ni, the film formed from the Perovskite structure type oxide or oxynitrides includes at least one element selected from the B2 group.

A semiconductor device according to a fifth aspect of the present invention includes: a pMIS transistor, the pMIS transistor comprising a gate insulating film which is formed on a semiconductor substrate, a gate electrode which is formed on the gate insulating film, and source-drain regions which are formed on the semiconductor substrate on both sides of the gate electrode, wherein the gate electrode includes a film formed from a rutile structure type oxide or oxynitrides of $AO_2$, and the A is constituted of at least one element selected from A1 group and A2 group, and wherein when the A1 group is constituted of Ti, Zr, Hf, and Ce, and the A2 group is constituted of W, Mo, Cr, Re, Tc, Mn, Os, Ru, Fe, Ir, Rh, Co, Pt, Pd, and Ni, the film formed from the rutile structure type oxide and oxynitrides of the $AO_2$ includes at least one element selected from the A2 group.

A method for manufacturing a semiconductor device according to a sixth aspect of the present invention includes: forming first electrode material films on first and second regions on a semiconductor substrate; introducing predetermined material into the first electrode material film on the second region to reform the same to a second electrode material film; and patterning the first and second electrode material films to form a first gate electrode on the first region and form a second gate electrode on the second region.

A method for manufacturing a semiconductor device according to a seventh aspect of the present invention includes: stacking a dummy insulating film and a dummy electrode material film on a first region and a second region of a semiconductor substrate, respectively; patterning the dummy electrode material film and the dummy insulating film to a dummy gate electrode and a dummy insulating film on the first and second regions; forming insulating films on side portions of the dummy gate electrode and dummy gate insulating film on the first and the second regions; removing the dummy gate electrode and dummy gate insulating film on the first and the second regions; embedding first electrode material films via first electrode material films in places from which the dummy gate electrode and the dummy gate insulating film have been removed to form first gate electrodes; and introducing predetermined material into the first gate electrode on the second region to reform the first gate electrode to a second gate electrode.

A method for manufacturing a semiconductor device according to a eighth aspect of the present invention includes: stacking a dummy insulating film and a dummy electrode material film on a first region and a second region of a semiconductor substrate, respectively; patterning the dummy electrode material film and the dummy insulating film to a dummy gate electrode and a dummy insulating film on the first and second regions; forming insulating films on side portions of the dummy gate electrode and dummy gate insulating film on the first and the second regions; removing the dummy gate electrode and dummy gate insulating film on the first and the second regions; embedding first electrode material films via first electrode material films in places from which the dummy gate electrode and the dummy gate insulating film have been removed to form first gate electrodes; causing the semiconductor substrate and the first gate electrode to react with each other to form a gate insulating film between the semiconductor substrate and the first gate electrode by conducting anneal in predetermined atmosphere; and introducing predetermined material into the first gate electrode on the second region to reform the first gate electrode to a second gate electrode.

BRIED DESCRIPTION OF THE DRAWINGS

FIG. 1 is a diagram showing ranges of preferable work functions suitable for an nMIS transistor and a pMIS transistor according to a semiconductor device according to a first embodiment of the present invention;

FIG. 2 is a sectional view showing a manufacturing step in a method for manufacturing a semiconductor device according to a second embodiment of the present invention;

FIG. 3 is a sectional view showing a manufacturing step in a method for manufacturing a semiconductor device according to the second embodiment of the present invention;

FIG. 4 is a sectional view showing a manufacturing step in a method for manufacturing a semiconductor device according to the second embodiment of the present invention;

FIG. 5 is a sectional view showing a manufacturing step in a method for manufacturing a semiconductor device according to the second embodiment of the present invention;

FIG. 6 is a sectional view showing a manufacturing step in a method for manufacturing a semiconductor device according to the second embodiment of the present invention;

FIG. 10 is a sectional view showing a manufacturing step in a method for manufacturing a semiconductor device according to the third embodiment of the present invention;

FIG. 11 is a sectional view showing a manufacturing step in a method for manufacturing a semiconductor device according to the third embodiment of the present invention;

FIG. 12 is a sectional view showing a manufacturing step in a method for manufacturing a semiconductor device according to the third embodiment of the present invention;

FIG. 13 is a sectional view showing a manufacturing step in a method for manufacturing a semiconductor device according to the third embodiment of the present invention;

FIG. 14 is a sectional view showing a manufacturing step in a method for manufacturing a semiconductor device according to the third embodiment of the present invention; and FIG. 15 is a sectional view showing a manufacturing step in a method for manufacturing a semiconductor device according to the third embodiment of the present invention.

DETAILED DESCRIPTION OF THE INVENTION

Figure 7:
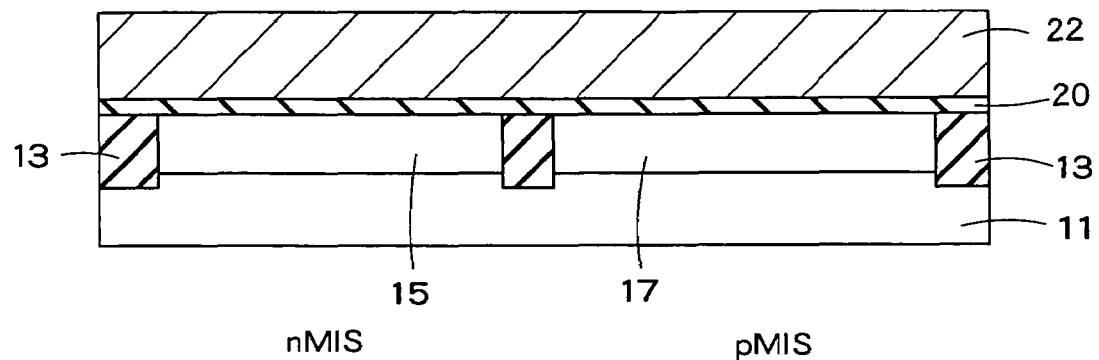
FIG. 7 is a sectional view showing a manufacturing step in a method for manufacturing a semiconductor device according to a third embodiment of the present invention.

Embodiments of the present invention will be explained below.

First Embodiment

A semiconductor device according to a first embodiment of the present invention has an nMIS transistor and a pMIS transistor formed on a silicon substrate. The nMIS transistor is provided with a gate insulating film formed on the silicon substrate, a gate electrode formed on the gate insulating film, and source-drain regions formed on the silicon substrate at both sides of the gate electrode. Similarly, the pMIS transistor is also provided with a gate insulating film formed on the silicon substrate, a gate electrode formed on the gate insulating film, and source-drain regions formed on the silicon substrate at both sides of the gate electrodes.

As shown in FIG. 1, the gate electrode of the nMIS transistor includes a first electrically conductive oxide film whose work function $\phi m$ (eV) is in a range 1 of $3.65 \leq \phi m \leq 4.45$. As shown in FIG. 1, the gate electrode of the pMIS transistor includes a second electrically conductive oxide film whose work function $\phi m$ (eV) is in a range 2 of $4.77 \leq \phi m \leq 5.57$. FIG. 1 is a diagram showing an energy band of silicon, where the lower limit value of the conduction band of silicon is 4.05 eV and the upper limit value of the valence band thereof is 5.17 eV.

Now, the upper limit value and the lower limit value of the work function are conditions for allowing the threshold voltage to be lowered to at least 0.4 V or less. When the conditions can not be satisfied, a transistor operating with a low threshold can not be obtained. Such a numeral as 0.4V which is the threshold voltage will be allowable maximum value to integrated circuits which will be developed in the future in a sense of power consumption and in a sense of device performance. In the future, the threshold voltage will advance to be lower than the above value.

Accordingly, when the MIS transistor is constituted in the above manner, fluctuation in threshold for respective transistors becomes very small and a MIS transistor with a low threshold voltage can be obtained.

Incidentally, it is made possible to shift the optimal value of the work function slightly toward a midgap direction of the energy band by using a counterdoping technique. However, since there is a limitation even in this technique, it is very effective for future integrate circuit development to develop a material group which allows arbitrary control on the work function in the above range.

According to the constitution, it is possible to form an nMIS transistor with a low threshold and a pMIS transistor with a low threshold.

(Gate Electrode Material)

Next, gate electrode materials having the work function in the above range will be explained.

First, optimization of gate electrode materials for the nMIS transistor and the pMIS transistor is performed. Briefly speaking, problems to be solved are as follows:

1) Roughness of interface between the gate insulating film and the gate electrode due to oxidation of the gate electrode and characteristic deterioration of a gate insulating film due to insulating of the gate electrode are avoided.

2) Materials with strong catalytic property are not selected as materials for the gate electrode.

3) Since there is a high possibility that simple metal diffuses into a gate insulating film, material constitution which can suppress diffusion is selected.

4) The work function is 4.05 eV or so for the nMIS transistor. An absolutely necessary condition for securely realizing a threshold voltage of 0.4 eV or less is that the work function $\phi m$ (eV) satisfies $3.65 \leq \phi m \leq 4.45$. The work function is 5.17 eV or so for the pMIS transistor. An absolutely necessary condition for securely realizing a threshold voltage of 0.4 eV or less is that the work function $\phi m$ (eV) satisfies $4.77 \leq \phi m \leq 5.57$.

In order to satisfy the above conditions, such a fact has been first found by the present inventors that electrically conductive oxide may be used for the gate electrode. The reason why there is not any example where electrically conductive oxides are used as materials for the gate electrodes to both the nMIS transistor and the pMIS transistor is because a desired work function can not be achieved. That is, this is because the method for adjusting a work function of electrically conductive oxide invented by the present inventors did not exist.

As the existing example, there is a literature describing the electrically conductive oxides without defining the work functions (for example, refer to JP-A-2002-289844). The Patent Literature describes that electrically conductive oxides are used in a gate electrode in an nMIS transistor. However, according to the inventors' examination result, it has been found that the electrically conductive oxides described in the Patent Literature are unsuitable for the nMIS transistor but suitable for the pMIS transistor. This will be because consideration for the work function has not been made in the Patent Literature. That is, according to the inventors' consideration, it has been found that $Sr(Ru_{1-x}Ti_x)O_3$ or $La_{1-x}Sr_xCoO_3$ which is mainly used as the electrically conductive oxide in the Patent Literature is one of the electrically conductive oxides which can be used for the pMIS transistor but it is an electrically conductive oxide which is never used in the nMIS transistor in view of the work function. When such oxide is used in the nMIS transistor, an extremely high threshold voltage is required, so that the nMIS transistor can not be used for an LSI.

In a sense of the known examples of the electrically conductive oxide, electrically conductive oxides such as $RuO_2$ (whose work function is 4.9 eV) are indicated in many school textbooks. However, since the electrically conductive oxides are gate electrode materials which can be used in only one MIS transistor such as the pMIS transistor, these oxides can not be used for producing a CMOS structure.

Since the electrically conductive oxide is the same oxide as the gate insulating film, it has an excellent affinity with the gate insulating film, which allows an excellent interface between the dielectric and the electrode. Therefore, there does not occur the problem explained in the item 1).

Since the electrically conductive oxide is material obtained as the result that it has been considerably stabilized as oxide, it may be considered that the electrically conductive oxide hardly has catalytic action as compared with metals or the like. As regards a catalytic property of the oxide, a problem arises when the oxide has oxygen defects on a surface thereof coming in contact with vacuum. However, since a structure where a gate electrode is exposed is not employed in an ordinary MIS transistor and covering on a surface of the gate electrode is conducted, the problem about the oxygen defects does not occur at all. Therefore, there does not occur the problem explained in the item 2).

Since oxides are stabilized, there is a possibility that diffusion may occur in an interface between oxides in a form of in-plane evenness depending on a combination of the oxides. However, it is not that a simple metal reaches in a substrate. Therefore, there does not occur the problem explained in the item 3).

As described below, the problem about the work function explained in the item 4) is solved by using the electrically conductive oxide, because the work function can be controlled considerably freely. Incidentally, the work function can be measured based upon photoelectric effect. It is made possible to manufacture an ideal gate insulating film and an ideal gate electrode interface by producing an nMIS structure and a pMIS structure by utilizing the manufacturing method explained in detail in this text. In that case, it is made possible to conduct inverse operation of the work function by measuring thresholds for operations of the nMIS transistor and the pMIS transistor.

(Gate Electrode Material for nMIS Transistor)

Next, the gate electrode material for the nMIS transistor will be explained.

Regarding the work function of the electrically conductive oxide, consideration is made from electron state. First, the electrically conductive oxides for the nMIS transistor will be examined. For the examination, an important hint is provided from electronic physical properties of an insulating oxide such as Perovskite type $SrTiO_3$ or rutile type $TiO_2$. The electron affinity of each of these materials is about 4.1 eV. The conduction band of the material comes from Ti.

In case of the Perovskite type $SrTiO_3$, when La or Y with electrons of the number more by one is introduced into an Sr site, the band structure of the conduction band hardly changes, and electron injection is made possible. At that time, the work function in each material can be controlled in a range of 4.1 eV (in case of Sr of 99.9%) to 4.0 eV (in case of Sr of 0%) according to the amount of La or Y. Since the resistivity of the material, or La or Y, becomes lower according to lowering of an Sr ratio, it is unnecessary to consider the constitution ratio thereof to Sr. Therefore, in view of easiness of production and such a fact that resistivity is very low, promising material includes $LaTiO_3$ (the work function is 4.0 eV and the resistivity is $5 \times 10^{-5}$ $\Omega \cdot cm$) and $YTiO_3$ (the work function is 4.0 eV and the resistivity is $5 \times 10^{-5}$ $\Omega \cdot cm$).

In case of the same Perovskite type $SrTiO_3$, an electrically conductive oxide for the nMIS transistor can be obtained by introducing Ta, Nb or V with electrons of the number more by one into the Ti site. At that time, a bottom of the conduction band has another band structure formed by interaction between Ti and material substituted for Ti. The positions of the bottom of the newly produced band for Ta, Nb, and V correspond to the positions of 4.2 eV, 4.3 eV, and 4.4 eV from the vacuum level. Therefore, the work functions can be respectively controlled in a very small range of 4.2 eV (when Ti is 99% and Ta is 1%) to 4.1 eV (when Ti is 0% and Ta is 100%), of 4.3 eV (when Ti is 99% and Nb is 1%) to 4.2 eV (when Ti is 0% and Nb is 100%), and of 4.4 eV(when Ti is 99% and V is 1%) to 4.3 eV (when Ti is 0% and V is 100%) according to constitution ratios of Ti to Ta, Nb, and V. The material is reduced in resistivity according to reduction in ratio of Ti. Therefore, in view of easiness of production and such a fact that resistivity is very low, promising material includes $SrTaO_3$ (the work function is 4.1 eV and the resistivity is $5 \times 10^{-5}$ $\Omega \cdot cm$), $SrNbO_3$ (the work function is 4.2 eV and the resistivity is $5 \times 10^{-5}$ $\Omega \cdot cm$), and $SrVO_3$ (the work function is 4.3 eV and the resistivity is $5 \times 10^{-5}$ $\Omega \cdot cm$).

The above discussion about the Perovskite type is not limited to a case that the base material is $SrTiO_3$. The A site is not required to be Sr, but it may be alkaline earth metal (Ca, Sr, Ba) or rare earth metal. A case that Zr, Hf, Ce, or the like is introduced into the B site containing Ti can be discussed in the substantially same manner as the above. Incidentally, since Zr, Hf, or Ce to Ti serves to raise the bottom of the conduction band, when Zr, Hf, or Ce to Ti is suppressed to 20% or less, the entirely same discussion as the case of $SrTiO_3$ can be made. When introduction of Zr, Hf, or Ce is conducted in an amount of about 20%, such partial change occurs that the electron affinities of the respective materials rise to 4.0 eV, 4.0 eV, and 3.9 eV (the magnitude is reduced).

Therefore, in the substitution in the A site, the work functions are respectively shifted by 0.1 eV, 0.1 eV, and 0.2 eV. For example, regarding $LaTiO_3$ (the work function is 4.0 eV and the resistivity is $5\times10^{-5}$ $\Omega\cdot cm$), La (Ti, Zr) $O_3$ (the work function is 3.9 eV and the resistivity is $7\times10^{-5}$ $\Omega\cdot cm$), La (Ti, Hf) $O_3$ (the work function is 3.9 eV and the resistivity is $1\times10^{-4}$ $\Omega\cdot cm$), and La (Ti, Ce) $O_3$ (the work function is 3.8 eV and the resistivity is $2\times10^{-4}$ $\Omega\cdot cm$) are obtained.

Regarding the B site substitution, the material subjected to 20% substitution only raises the bottom of the conduction band and a large change does not appear in the work function. Since the interactions of Zr, Hf, and Ce with the material used for substitution, Ta, Nb, and V gradually decreases in the order of Zr, Hf, and Ce, as compared with Ti, it is to be noted that gradual deterioration occurs in a sense of electric resistivity. Since reduction resistivity is increased by introduction of Zr, Hf, or Ce, introduction of these materials can be conducted, as necessary, together with operation of the work function.

On the other hand, since the electron affinity decreases to about 3.1 eV or less in $SrZrO_3$, $SrHfO_3$, or $SrCeO_3$, which does not include Ti, a gate electrode for the nMIS transistor can not be obtained by introduction of La or Y. In this case, it is possible to obtain an electrically conductive electrode for an nMIS transistor by introduction of Zr, Hf, or Ce like the case of Ti.

Here, regarding the whole invention, the following point is to be noted. Since similar characteristics are obtained in any film of a film of a polycrystal state, a film of amorphous state, and a film obtained by epitaxial growth including an orientation film, the discussion of the invention in this text does not depend on the state.

Such a case will occur that A site material and B site material have been mixed with each other. For example, in (La, Sr)(Ti, Nb)$O_3$, it is thought that the B site material determines the bottom position of the conduction band to which electron injection takes place from La. In $LaNbO_3$ which is an extreme example, the work function is 4.05 eV and the resistivity is $5\times10^{-6}$ $\Omega\cdot cm$. By employing such a constitution, the number of electrons contributing to conduction can be increased, so that the electric resistivity can be lowered one or more digits.

In the above description, the A site materials and the B site materials of the Perovskite structure suitable for the nMIS transistor have been referred to. However, adjustment of the work function can be made finely by ratio change of these materials, of course.

Further, there may be a structure where the A site material is excessively included. Such a structure is regarded as extension to a layered Perovskite structure. Therefore, it is made possible to increase the electron injection amount and lower the electric resistivity. For example, in excessive introduction of La into $LaTiO_3$, when only a LaO component is introduced excessively, material, $La_2TiO_4$ is produced. The work function of the material is smaller than that of the $LaTiO_3$ (4.0 eV$\rightarrow$3.9 eV) and the electric resistivity thereof is remarkably lowered. In measurement of an actual film, it was possible to achieve lowering of about one digit.

It is also confirmed that, even if the amount of La is not increased up to the above amount, the electric resistivity can be lowered by increasing the ratio of La and Ti to more than 1. Of course, it is possible to employ a structure in which a further large amount of LaO layer has been introduced. However, in view of the problem about stability of the layered Perovskite structure, it is preferable that the amount to be excessively introduced satisfies La/Ti$\leqq$3.0. When the amount exceeds this range, such a possibility occurs that LaO segregates and the work function changes urgently, which results in difficulty in control.

Even in the rutile type $TiO_2$, similar discussion will be made. The discussion about only the B site portion in the Perovskite structure may be applied to the rutile type $TiO_2$ as it is. For example, (Ti, Nb) $O_2$ or the like can be used for the nMIS transistor.

Next, materials with another structure will be explained briefly.

(NaCl Type (Rocksalt Structure))

Such material as TiO (the work function of 4.1 eV and the electric resistivity of $3\times10^{-4}$ $\Omega cm$), VO (the work function of 4.3 eV and the electric resistivity of $2\times10^{-3}$ $\Omega cm$), and NbO (the work function of 4.2 eV and the electric resistivity of $1.5\times10^{-5}$ $\Omega cm$) are proposed. However, since such a possibility is high that each of the materials loses its electric conductivity due to advance of oxidation, further research must be conducted in order to use the material.

(Corundum Type)

Oxidation advances in $Ti_2O_3$ like the above. $V_2O_3$ has a work function of 4.4 eV and an electric resistivity of $1\times10^{-3}$ $\Omega cm$, and is electrically conductive oxide. However, since such a possibility is high that the material loses its electric conductivity due to advance of oxidation, further research must be conducted in order to use the material.

(Gate Electrode Material for pMIS Transistor)

Next, electrically conductive oxides used as gate electrode material for the pMIS transistor will be examined. For the examination, an important hint is provided from electronic physical properties of an insulating oxide such as Perovskite type $SrTiO_3$ or rutile type $TiO_2$ like the above. The electron affinity of each of these materials is about 4.1 eV. The conduction band of the material comes from Ti.

In case of the Perovskite type $SrTiO_3$, electrically conductive oxide for the pMIS transistor can be obtained by introducing material with electrodes of the number more by two or more into the Ti site. At that time, the conduction band is constituted with material introduced newly. The position of the work function obtained from the newly produced band depends on the material. Such a fact is collectively shown below. In the following, the work function and the electric resistivity are shown in parentheses.

$SrWO_3$ (4.77 eV and $5\times10^{-3}$ $\Omega cm$); $SrMoO_3$ (4.82 eV and $4\times10^{-4}$ $\Omega cm$); $SrCrO_3$ (4.9 eV and $5\times10^{-4}$ $\Omega cm$); $SrReO_3$ (4.79 eV and $1\times10^{-4}$ $\Omega cm$); $SrTcO_3$ (4.89 eV and $1\times10^{-4}$ $\Omega cm$); $SrMnO_3$ (4.99 eV and $1\times10^{-4}$ $\Omega cm$); SrOsO3 (5.1 eV and $6\times10^{-5}$ $\Omega cm$); $SrRuO_3$ (5.1 eV and $3\times10^{-5}$ $\Omega cm$); $SrFeO_3$ (5.2 eV and $5\times10^{-5}$ $\Omega cm$); $SrIrO_3$ (5.05 eV and $5\times10^{-5}$ $\Omega cm$); $SrRhO_3$ (5.15 eV and $7\times10^{-5}$ $\Omega cm$); $SrCoO_3$ (5.25 eV and $5\times10^{-5}$ $\Omega cm$); $SrPtO_3$ (5.1 eV and $5\times10^{-4}$ $\Omega cm$); $SrPdO_3$ (5.2 eV and $5\times10^{-4}$ $\Omega cm$); and $SrNiO_3$ (5.3 eV and $5\times10^{-4}$ $\Omega cm$).

Here, it has been found that the value of the work function hardly depends on the amount of material introduced newly. This is because a band width changes according to the amount of material introduced into the B site but the position of Fermi level hardly changes. Since the number of participating electrons is rapidly increased, the electric resistivity largely depends on the amount of material. Basically it is preferable that the number of electrons is increased. More specifically, for example, Sr(Ti, Ru)O$_3$ does not depend on the amount of Ru (several % up to 100%), where the work function becomes 5.1 eV. Incidentally, Sr(Ti, Ru)O$_3$ does not develop excellent conductivity unless the amount of Ru is 50% or more. When the amount of Ru is 50% or more, Sr(Ti, Ru)O$_3$ develops excellent conductivity in a range of the amount up to 100%.

In the Perovskite structure, the conductivity can be controlled even by an A site defect. As promising materials, there are Sr$_x$PeO$_3$, Sr$_x$WO$_3$, Sr$_x$MoO$_3$ and Sr$_x$NbO$_3$. Incidentally, Sr$_x$NbO$_3$ has a work function for the nMIS transistor. At that time, the electric resistivity becomes $10^{-5}$ Ωcm or less, so that oxide with very low resistivity can be obtained. Here, the A site is not required to be Sr, but it may be alkaline earth metal or rare earth metal.

Next, the rutile structure will be examined. There are many electrically conductive oxides suitable for the pMIS transistor. The discussion about only the B site portion in the Perovskite structure may be applied to the rutile structure as it is. Especially, since the following electrically conductive materials are effective since their electric resistivities are low.

WO$_2$ (4.77 eV, $5\times10^{-3}$ Ωcm); MoO$_2$ (4.82 eV, $4\times10^{-4}$ Ωcm); CrO$_2$ (4.9 eV, $5\times10^{-4}$ Ωcm); ReO$_2$ (4.79 eV, $1\times10^{-4}$ Ωcm); TcO$_2$ (4.89 eV, $1\times10^{-4}$ Ωcm); MnO$_2$ (4.99 eV, $1\times10^{-4}$ Ωcm); OSO$_2$ (5.1 eV, $6\times10_{-5}$ Ωcm); RuO$_2$ (5.1 eV, $3\times10^{-5}$ Ωcm); FeO$_2$ (5.2 eV, $5\times10^{-5}$ Ωcm); IrO$_2$ (5.05 eV, $5\times10^{-5}$ Ωcm); RhO$_2$ (5.15 eV, $7\times10^{-5}$ Ωcm); CoO$_2$ (5.25 eV, $5\times10^{-5}$ Ωcm); PtO$_2$ (5.1 eV, $5\times10^{-4}$ Ωcm); PdO$_2$ (5.2 eV, $5\times10^{-4}$ Ωcm); and NiO$_2$ (5.3 eV, $5\times10^{-4}$ Ωcm)

In the above, the work function and the electric resistivity are shown in parentheses.

In the above, the electrically conductive oxides suitable for the nMIS transistor and the pMIS transistor have been described.

Next, an actual film forming method will be described. When the gate electrodes for the nMIS transistor and the pMIS transistor are produced independently of each other, it is only required to select proper electrically conductive oxides from the above to perform film forming, where any problem does not occur when optimization of material has been achieved. However, when a film is desired to be formed as simply as possible, for example, a method is considered which produces an electrically conductive electrode for an nMIS transistor and introduces other material into only a portion for a pMIS transistor by ion implantation or thermal diffusion to reform the portion for the pMIS transistor. For example, a method is considered which first produces a (Sr$_{1-y}$, La$_y$) TiO$_3$ film ($0 \leq y \leq 1$) where a work function is about 4.1 eV to introduce Ru into a pMIS portion by diffusion. At that time, a (Sr, La)$_x$(Ti, Ru)O$_3$ film ($0 \leq x \leq 1$) is formed on a PMIS transistor portion, where the work function is about 5.1 eV. Here, post-introduction of the B site material with the Perovskite structure is carried out, which serves to reduce a ratio of the A site material to the B site material. Reforming for the pMIS transistor can be achieved as the result of Ru introduction itself, and the electric resistivity can be further reduced by introduction of the A site defect.

Here, such a fact is understood that the value of the work function be rapidly changed by introduction of Ru in a certain amount or more so that it is changed to a value suitable for the pMIS transistor in a stepwise manner. The rapid change has a much significant meaning. That is, the rapid change means that, since decided values determined depending on the material to be used can be used in the nMIS transistor or the pMIS transistor region, the work function does not fluctuate at all for each MIS transistor so that an excellent MIS which does not cause characteristic fluctuation can be produced. The Ru amount causing rapid change of the work function depends on the amount of La. When the Ru amount to the value of y in the (Sr$_{1-y}$, La$_y$) TiO$_3$ film is 0.3×y or more, the work function jumps to 5.1 eV. In view of the electric resistivity, however, it is desirable that the Ru amount to Ti is 0.5 or more (50% or more). Not only Ru but also material to be introduced into the B side is introduced as much as possible, because the electric resistivity is made as small as possible. In this meaning, a method which forms a SrRuO$_3$ film on the (Sr$_{1-y}$, La$_y$) TiO$_3$ for the pMIS transistor portion to introduce the Ru into the B site utilizing thermal diffusion will also be effective in the above process.

As described above, the work function of the electrically conductive oxide now under consideration changes stepwise, and the work function takes the same value stably even if the amount of introduction changes finely. This means that threshold fluctuation does not occur for each transistor, which is significantly important. In the present situation, a problem about fluctuation of the work function arises, especially, in nitride or the like. Effectiveness of the present invention can be found in the problem.

In view of the electric conductivity, it is advantageous that the B site material is moved to a defect side of the B site material by introduction of the A site material for the nMIS transistor (this is another expression of the excessive introduction of the A site material as described above), and it is also advantageous that the A site material is moved to the defect side of the A site material by introduction of the B site material for the pMIS transistor.

In the above embodiment, the material for the nMIS transistor is first formed in a film. On the contrary, it is considered that the material for the pMIS transistor is first formed in a film and a portion of the film is then reformed for the nMIS transistor. For example, there is such a case that Sr(Tr, Ru)O$_3$ is formed in a film for the pMIS transistor, and reformation is made for the nMIS transistor by introducing La into a portion of the film. The work functions are respectively about 5.1 eV for the pMIS transistor and about 4.0 eV for the nMIS transistor.

It is also possible to first form an insulating film of SrTiO$_3$ and then introduce La and Ru into portions of the film for the nMIS transistor and the pMIS transistor, respectively. In that case, defects occurs in the B site and the A site, respectively, thereby allowing formation of a film with a low electric resistivity.

In some materials, it is also made possible to perform a full processing for processes for producing an electrode film and a thin film with a high-k dielectric constant by causing an electrode and a dielectric film to react with each other or causing the electrode and a substrate Si to react with each other during film forming or during annealing operation after film forming. In the full processing process, an interface between the dielectric and the electrode is made considerably stable, because there are many common portions between components of the dielectric film and components of the electrode. Materials suitable for this processing are limited, where it is required that a stable silica film is produced but a layer with a low-k dielectric constant (SiO$_2$) is not produced. However, in case of the gate electrode material for the pMIS transistor, for example, SrRuO$_3$, SiO$_2$ eventually occurs in an interface between Si and an electrode. This results from such a fact that $RuO_2$ or the like is more unstable than $SiO_2$. It should be avoided to cause the electrode material for the pMIS transistor to grow directly on Si. That is, it is understood that it is unsuitable to cause the electrode material for the pMIS transistor to grow on the Si substrate to cause a reaction layer to serve as the gate insulating film. In that case, it is necessary to produce the electrode after producing the gate insulating film. Since it is the matter of course to employ very stable material as the oxide for the gate insulating film, when the oxide electrode described above is further placed on the gate insulating film, such an advantageous state occurs that, when oxygen shortage occurs in the dielectric, oxygen is supplied from the electrode to the dielectric.

Next, the electrode for the nMIS transistor will be examined. In that case, it is understood that a large amount of material which does not cause a low-k dielectric even if the electrode is formed directly on the Si substrate is contained. Elements which allow such a phenomenon are very restrictive, as described below.

Be, Mg, Ca, Sr, Ba, Al, Sc, Y, La, Ti, Zr, Hf, and Ce. For example, when direct production on the Si substrate is performed using $(La, Sr) TiO_3$ which is an electrode material for an nMIS transistor, a silicate electrode thin film with a high-k dielectric mainly containing La silicate is formed thereon. Here, when nitrogen is introduced in the formation, it is made possible to restrict diffusion of metal into the silicate film remarkably. Therefore, even if the formed electrode film is caused to pass through a process with a high temperature, silicate is present stably without being crystallized. Since nitrogen also serves to improve dielectric constant of the silicate film, the nitrogen introduction is very effective. When the electrode film is formed on the Si substrate in this manner and the dielectic film is formed in a process for the electrode film forming, a process performed after the film forming process, or both the processes, a process for producing a dielectric material film can be made unnecessary. Further, since the silicate film is naturally produced in the process, it is possible to produce an electrode for an nMIS transistor with very stable and excellent interfaces between the substrate and the dielectric material and between the dielectric material and the electrode.

The dielectric material film on the pMIS transistor region can be formed in lamp through the process for producing the electrode for the nMIS transistor, the process for dielectric film generation, and the process for reforming the gate electrode in the pMIS transistor region. For example, the dielectric film formation may be achieved by processes of directly producing $(La, Sr)TiO_3$ film on Si, generating silicate film on the interface, and diffusing $SrRuO_3$ into the pMIS transistor region.

Alternatively, the dielectric films on the nMIS transistor and the pMIS transistor can be formed in lamp through processes of first producing an insulating film, generating a dielectric film and reforming gate electrodes on the nMIS transistor region and the pMIS transistor region. For example, the dielectric film formation may be achieved by processes of directly producing $SrTiO_3$ film on Si, generating a silicate film on an interface, diffusing La (or Nb) into the nMIS transistor region, and diffusing Ru into the pMIS transistor region.

In the present invention, since stability of the electrode materials is very high, various materials can be used for the gate insulating film. $SiO_2$, SiON, silicate, or nitrides of silicate, metal oxides, or metal nitride can be used for the gate insulating film. A reaction film obtained by each of the insulating films and the electrically conductive oxide introduced in the invention or a stacked film (a stacked film of an non-reacted portion and the reaction film) may be used as the insulating film. As described above, it is possible to use, as the insulating film, the reaction layer produced when the electrically conductive oxide according to the present invention is formed directly on the Si substrate. On the other hand, it is not possible to use an ordinary metal film as the insulating film in such a board range. For example, this is because ordinary metal enters in the SiON film to increase current leakage or causes interface roughness to increase current leakage in some cases.

As explained above, according to the embodiment, it is made possible to obtain an n type and p type MISFETs with a low threshold voltage, where roughness of an interface between a gate insulating film and a gate electrode due to oxidation or characteristic lowering of the gate insulating film due to insulation of the gate electrode does not occur. The gate electrode does not have catalytic property and a simple metal is prevented from being diffused in the gate insulating film or in a silicon substrate unnecessarily. A MIS transistor with remarkably reduced fluctuation in threshold for each transistor and with a low threshold voltage can be obtained.

Second Embodiment

Next, a method for manufacturing a semiconductor device according to the present invention will be explained with reference to FIG. 2 to FIG. 6. FIGS. 2 to 6 are sectional views of a semiconductor device in respective manufacturing steps in the manufacturing method according to the embodiment.

As shown in FIG. 2, first, device isolation regions 13 which separate a formation region for a pMIS transistor and a formation region for an nMIS transistor on a semiconductor substrate, for example, a silicon substrate 11. The device isolation regions 13 are formed, for example, by STI (Shallow Trench Isolation). The device isolation regions 13 can be formed, for example, by LOCOS (Local Oxidation of Silicon) technique, too. Thereafter, a P well 15 is formed on the formation region for an nMIS transistor, and an n well 17 is formed on the formation region for a pMIS transistor. Next, impurities are introduced into the p well 15 and the n well 17 in order to adjust threshold voltages. Formation of the P well 15 and the n well 17 can be carried out, for example, by ion implantation process using a mask with openings corresponding to the respective regions.

Next, a gate insulating film 19 is formed on the silicon substrate 11. The gate insulating film 19 is formed by depositing oxynitrided hafnium silicate film with a thickness of 3 nm at a substrate temperature of 400° C. according to CVD (Chemical Vapor Deposition) process. Thereafter, an electrode film 21 formed of $(La, Sr) TiO_3$ for an nMIS transistor is formed on the gate insulating film 19 so as to have a thickness of 50 nm according to CVD process (refer to FIG. 2).

Next, photoresist is applied on the electrode film 21, and a resist pattern 25 having an opening corresponding to the formation region of the pMIS transistor is formed according to lithography technique (refer to FIG. 3). Ru is introduced in the electrode film 21 on the formation region of the pMIS transistor according to ion implantation process using the resist pattern 25 as a mask, and an electrode film 23 formed of $(La, Sr) (Ti, Ru)O_3$ for the pMIS transistor is obtained utilizing thermal diffusion. According to the ion implantation process, ion implantation is performed such that the Ru concentration in the electrode film 23 formed of $(La, Sr) (Ti, Ru)O_3$ for the PMIS transistor becomes 50% at a ratio of Ru/(Ru+Ti).

The thermal diffusion is performed, for example, in nitrogen atmosphere at a processing temperature of 1050° C. for a set processing time of 30 seconds, after the resist pattern 25 is removed. As the heat treatment, an optimal method can be selected from the existing heat treatment methods such as, for example, spike anneal, laser anneal, and lamp anneal, and the heat treatment can be performed at a stage of an activating heat treatment for impurities conducted later.

In the formation of the electrode film for the PMIS transistor, the electrode film 23 formed of (La, Sr) (Ti, Ru)$O_3$ for the PMIS transistor can be obtained by forming a SrRuO$_3$ film on the pMIS transistor region according to CVD process, instead of the ion implantation process, to perform thermal diffusion.

Next, photoresist is applied on the electrode films 21 and 23, the photoresist is patterned according to ordinary lithography technique, and a resist pattern 27 for forming gate electrodes is formed (refer to FIG. 4). The electrode films 21 and 23 are patterned by conducting etching using the resist pattern 27 as a mask so that respective gate electrodes 21 and 23 are obtained (refer to FIG. 4).

Subsequently, after the resist pattern 27 is removed, a resist pattern (not shown) which covers only the formation region for the pMIS transistor is formed, and a low concentration n-type diffusion layer 29 is formed by doping impurities in the formation region for the nMIS transistor using the gate electrode 21 as a mask (refer to FIG. 5). After the resist pattern is removed, a resist pattern (not shown) which covers only the formation region for the nMIS transistor is formed, and a low concentration p-type diffuison layer 31 is formed by doping impurities into the formation region for the pMIS transistor using the gate electrode 23 as a mask (refer to FIG. 5). Thereafter, the resist pattern is removed.

Next, as shown in FIG. 6, side walls 33 formed of insulating material are formed on sides of the gate electrodes 21 and 23 using a well-known technique. A resist pattern (not shown) which covers the formation region for the pMIS transistor is formed, and an n type source-drain diffusion layer 35 is formed by doping impurities into the formation region for the nMIS transistor using the gate electrode 21 and the side walls 33 as masks (refer to FIG. 6). After the resist pattern is removed, a resist pattern (not shown) which covers the formation region for the nMIS transistor is formed, and a p type source-drain diffusion layer 37 is formed by doping impurities into the formation region for the pMIS transistor using the gate electrode 23 and the side walls 33 as masks (refer to FIG. 6). Thereafter, as shown in FIG. 6, an nMIS transistor and a pMIS transistor are completed by removing the resist pattern.

In the manufacturing method according to this embodiment, formation of the gate electrode 21 of the nMIS transistor and the gate electrode 23 of the PMIS transistor is achieved by performing only one step of forming the electrode film 21, a step of forming the resist pattern 25 for using a mask for Ru introduction, a step of forming the resist pattern 27 applied when the gate electrode portions are cut out, and a step of patterning the gate electrodes. Therefore, the number of steps in this embodiment is reduced as compared with a case that the gate electrode 21 of the nMIS transistor and the gate electrode 23 of the pMIS transistor are formed separately of each other, which results in easiness of manufacturing.

In the manufacturing method according to the embodiment, the gate electrode 21 of the nMIS transistor is the (La, Sr)TiO$_3$ film, where the work function is 4.05 eV. On the other hand, the gate electrode 23 of the pMIS transistor is the (La, Sr)(Ti, Ru)$O_3$ film produced by ion-implanting Ru into the electrode film 21, where the work function is 5.10 eV. Since the work function at the lower limit of the conduction band of silicon is 4.05 eV, and the work function of the valence band is 5.17 eV, it is possible to reduce the threshold voltages for both the nMIS transistor and the pMIS transistor to 0.4V or less.

(First Modification)

Incidentally, as a first modification of the first embodiment, nMIS transistors and pMIS transistors were produced, while the gate electrode materials explained in the first embodiments were exchanged variously. It was confirmed that these transistors could be operated at low thresholds.

(Second Modification)

Further, a second modification of the embodiment will be explained. In the second modification, a step of directly forming oxynitrides (La, Sr) TiON film on silicon substrate 11 as the gate electrode film was conducted without conducting a step of forming a gate insulating film 19 on the silicon substrate 11. Thereafter, anneal was performed in nitrogen atmosphere at a substrate temperature of 600° C. so that oxynitrided lanthanum silicate film with a thickness of 2 nm was formed on an interface between the silicon substrate and the gate electrode film. Steps subsequent to this step can be performed in the same manner as those in the second embodiment by regarding this interface layer (oxynitrided lanthanum silicate film) as the gate insulating film 19. Since the interface layer is produced due to an interface reaction with the silicon substrate, defects of the interface between the silicon substrate and the gate insulating film are remarkably reduced. Therefore, when mobility is measured after manufacturing the MIS transistor, the MIS transistor with a very high mobility can be obtained as compared with that manufactured by the manufacturing method of the second embodiment. Since the interface between the gate insulating film and the gate electrode is the reaction layer, interface defects are reduced, so that an excessive reaction at the interface defects, for example, a reaction of La silicate and water, does not occur. Therefore, it is possible to keep the characteristics of the gate insulating film and the electrodes in an excellent state.

Third Embodiment

Next, a method for manufacturing a semiconductor device according to a third embodiment of the present invention will be explained with reference to FIG. 7 to FIG. 15. The manufacturing method is constituted so as to perform formation of a gate electrode by a damascene process. FIGS. 7 to 15 are sectional views of manufacturing steps performed in the manufacturing method of the embodiment.

As shown in FIG. 7, first, device isolation regions 13 which separate a formation region for a pMIS transistor and a formation region for an nMIS transistor on a silicon substrate 11 are formed like the second embodiment. Subsequently, a dummy gate insulating film 20 to be removed in a step described later is formed of silicon oxide film with a thickness of, for example, 20 nm on the silicon substrate. Next, for example, a dummy gate electrode film 22 to be removed in a step described later is formed of a polycrystal silicon film with a thickness of, for example, 80 nm according to CVD process.

Figure 8:
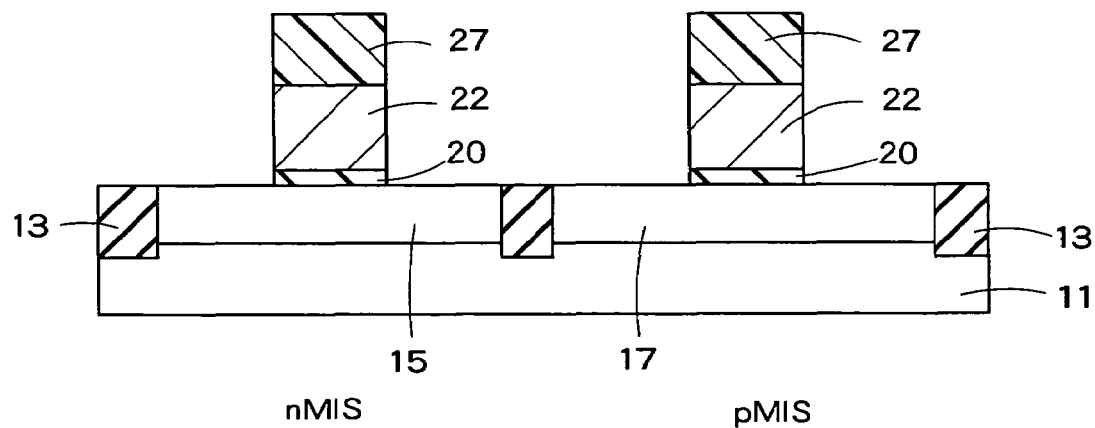
FIG. 8 is a sectional view showing a manufacturing step in a method for manufacturing a semiconductor device according to the third embodiment of the present invention.
Figure 9:
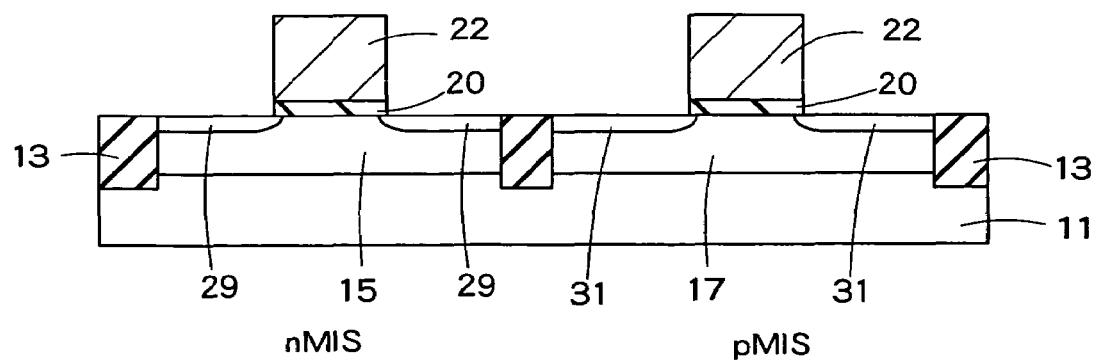
FIG. 9 is a sectional view showing a manufacturing step in a method for manufacturing a semiconductor device according to the third embodiment of the present invention.

Next, after photoresist is applied on the dummy gate electrode film 22, the photoresist is patterned according to lithography technique, so that a resist pattern 27 for forming a dummy gate electrode is formed (refer to FIG. 8). The dummy gate electrode film 22 is patterned by performing etching using the resist pattern 27 as a mask, so that the dummy gate electrode 22 for a pMIS transistor and the dummy gate electrode 22 for an nMIS transistor are formed. Thereafter, the resist pattern 27 used as the mask is removed.

Next, a resist pattern (not shown) which covers a formation region for the pMIS transistor and has an opening corresponding to a formation region for the nMIS transistor is formed, and n type impurities (for example, phosphorus or arsenic) is introduced into a p well region 15 using the resist pattern and the dummy gate electrode 22 as masks, so that low concentration diffusion layers 29 for the nMIS transistor are formed. Thereafter, the resist pattern is removed (refer to FIG. 9). Then, a resist pattern (not shown) which covers a formation region for the nMIS transistor and has an opening corresponding to the formation region for the pMIS transistor is formed, and p type impurities (for example, boron or boron difluoride) is introduced into an n well region 17 using the resist pattern and the dummy gate electrode 22 as masks, so that low concentration diffusion layers 31 for the pMIS transistor are formed. Thereafter, the resist film is removed (refer to FIG. 9).

Next, heat treatment is performed. As conditions for the heat treatment, setting is made such that atmosphere is nitrogen, a processing temperature is 1050°, and a processing time is 30 seconds. Incidentally, as the heat treatment, a proper method can be selected properly from existing heat treatment methods such as, for example, spike anneal, laser anneal, or lamp anneal. The impurities in the low concentration diffusion layer 29, 30, the p well region 15, and the n well region 17 are activated by the heat treatment.

Next, after an insulating film is formed on the whole surface, the insulating film is etched back, so that side walls 33 are formed on respective side portions of the dummy gate electrode 20 (refer to FIG. 10). The insulating film is formed by depositing silicon nitride, for example, according to chemical vapor deposition process. Thereafter, a resist pattern (not shown) which covers the formation region for the pMIS transistor and has an opening corresponding to the formation region for the nMIS transistor is formed. N type impurities (for example, phosphorus or arsenic) are introduced into the p well region 15 using the resist pattern, the dummy gate electrodes 22, and the side walls 33 as masks, so that source-drain diffusion layers 35 for the nMIS transistor are formed on the p well region 15 on the both sides of the dummy gate electrode 20 via the low concentration diffusion layers 29. Thereafter, the resist pattern is removed (refer to FIG. 10). Next, a resist pattern (not shown) which covers the formation region for the nMIS transistor and has an opening corresponding to the formation region for the pMIS transistor is formed. P type impurities (for example, boron or boron difluoride) is introduced into the p well region 17 using the resist pattern, the dummy gate electrode 22, and the side walls 33 as masks, so that source-drain diffusion layers 37 for the pMIS transistor are formed on the p well region 17 on the both sides of the dummy gate electrode 22 via the low concentration diffusion layers 31. Thereafter, the resist pattern is removed (refer to FIG. 10).

Next, an inter-layer insulating film which covers the dummy gate electrodes 22 is formed using CVD process. The inter-layer insulating film is formed of, for example, a silicon oxide film. Incidentally, the inter-layer insulating film is formed so as to be at least higher than the dummy gate electrode 22. Then, a surface of the inter-layer insulating film 40 is planarized and an upper faces of the dummy gate electrodes 22 are exposed according to CMP (Chemical Mechanical Polishing) (refer to FIG. 11).

Next, as shown in FIG. 12, the dummy gate electrodes 22 and the dummy gate insulating films 20 positioned under them are removed by etching process, so that gate grooves 41 are formed. Accordingly, the dummy gate electrodes 22 and the dummy gate insulating films 20 must be formed of materials having etching rates higher than those of the side walls 33 and the inter-layer insulating film 40.

As shown in FIG. 13, for example, oxynitrided hafnium silicate is deposited on inner faces of the gate grooves 41 in a thickness of 4 nm so that gate insulating films 43 are formed using CVD process. At that time, an oxynitrided hafnium silicate film (not shown) is also formed on the inter-layer insulating film 40. Further, electrode films 45 formed of (La, Sr)TiO$_3$ are formed so as to fill in the gate electrodes 41 using CVD process. The electrode film and the oxynitrided hafnium silicate film formed on the inter-layer insulating film 40 is removed according to CMP. Thus, the gate electrodes 45 embedded into the gate grooves 41 via the gate insulating films 43 are formed (refer to FIG. 13).

Next, as shown in FIG. 14, photoresist is applied on the interlayer insulating film 40 and a resist pattern 47 which is then formed with opening 47a corresponding to the formation region for the pMIS transistor is formed using lithography technique. Ru is introduced into the gate electrode 45 on the formation region for the PMIS transistor by ion implantation using the resist pattern 47 as a mask, so that the gate electrode 45 is reformed into a gate electrode 49.

Subsequently, after the resist pattern 47 is removed, heat treatment is performed. As conditions for the heat treatment, setting is made such that atmosphere is nitrogen, a processing temperature is 550°, and a processing time is 3 minutes. Incidentally, as the heat treatment, selection can be made properly from existing heat treatment methods such as, for example, spike anneal, laser anneal, and lamp anneal. The gate electrode 45 is reformed to the gate electrode 49 for the pMIS transistor due to diffusion of Ru into the gate electrode 49 by the heat treatment. In that case, since activation at a low temperature is satisfactory, a range of materials usable for the gate insulating film is expanded largely. Accordingly, such a material that dielectric is high but crystallization takes place due to heat, for example, ZrO$_2$, HfO$_2$ can be used for the gate insulating film.

Thus, the gate electrode 45 for the nMIS transistor and the gate electrode 49 for the pMIS transistor are formed in the gate grooves 41 via the gate insulating films 43, so that an nMIS transistor and a pMIS transistor are completed (refer to FIG. 15).

In the manufacturing method of the embodiment, after the gate electrode 45 for the nMIS transistor and the gate electrode 49 for the pMIS transistor are formed from (Sr, La)TiO$_3$, the (Sr, La)(Ti, Ru)O$_3$ gate electrode 49 is formed by selectively introducing Ru into the gate electrode for the pMIS transistor. Accordingly, the gate electrode 45 for the nMIS transistor and the gate electrode 49 for the pMIS transistor can be formed by only one film forming step for the (Sr, La)TiO$_3$ film and two lithography steps including the forming step of the resist mask used when patterning is conducted on the dummy gate electrodes filled with (Sr, La)TiO$_3$ formed in a film due to use of the mask for Ru introduction, and two removal steps conducted when the dummy gate electrodes are patterned and when removal is performed. Therefore, the manufacturing method of the embodiment is reduced in number of steps as compared with the conventional manufacturing method which is constituted so as to form a metal film for forming the gate electrode for the pMIS transistor and a metal film for forming the gate electrode for the nMIS transistor separately of each other, which results in simplicity and convenience.

In the manufacturing method according to the embodiment, the gate electrode 45 for the nMIS transistor is the (La, Sr)TiO$_3$ film, where the work function is 4.05 eV. On the other hand, the gate electrode 49 for the pMIS transistor is the (La, Sr)(Ti, Ru)O$_3$ film produced by ion-implanting Ru into the electrode 45, where the work function is 5.1 eV. Since the work function at the lower limit of the conduction band of silicon is 4.05 eV, and the work function of the valence band is 5.17 eV, it is possible to reduce the threshold voltages for both an N channel transistor and a P channel transistor to 0.4V or less.

(First Modification)

Incidentally, as a first modification of the third embodiment, nMIS transistors and pMIS transistors were produced, while the gate electrode materials explained in the third embodiments were exchanged variously. It was confirmed that these transistors could be operated at low thresholds.

(Second Modification)

A second modification of the third embodiment will be explained. In the second modification, first, a step of directly forming oxynitrides (La, Sr) TiON in the gate grooves 41 as the gate insulating films was conducted without forming the gate insulating films 43 in the gate grooves 41. Thereafter, anneal is performed at a substrate temperature of 550° C. in nitrogen atmosphere so that an oxynitrided lanthanum silicate film with a thickness of 2 nm is formed at an interface between the silicon substrate and the gate electrode film. By regarding the interface layer (oxynitrided lanthanum silicate film) as the gate insulating film 43, steps subsequent to the above step can be conducted in the same manner as the those in the third embodiment. Since the interface layer is produced due to interface reaction with the silicon substrate, defects in the interface between the silicon substrate and the gate insulating film are significantly reduced. Therefore, when mobility is measured after manufacturing the MIS transistor, the MIS transistor with a very high mobility can be obtained as compared with that manufactured by the manufacturing method of the second embodiment. Since the interface between the gate insulating film and the gate electrode is the reaction layer, interface defects are reduced, so that an excessive reaction at the interface defects, for example, a reaction of La silicate and water, does not occurs. Therefore, it is possible to keep the characteristics of the gate insulating film and the electrodes in an excellent state.

The material for the gate insulating film, the forming method of the gate insulating film and the film thickness thereof, the material for the gate electrode film, the forming method of the gate electrode film and the film thickness thereof, the material for conducting conversion between the nMIS transistor and the pMIS transistor (Ru is used in the above embodiment), the introducing method of the material and the introduction amount thereof, and the structures of the transistors are simply illustrative. When the work function value of the gate electrode for the pMIS transistor is a value approximating to the upper limit work function value of the valence band of silicon and the work function value of the gate electrode for the nMIS transistor is a value approximating to the lower limit work function value of the conduction band of silicon, the above items can be changed properly.

As explained above, according to each embodiment of the present invention, since the work function of the gate electrode for the pMIS transistor can be brought close to the upper limit of the valence band of silicon and the work function of the gate electrode for the nMIS transistor can be brought close to the lower limit of the conduction band of silicon, it is made possible to reduce the high threshold voltage of the metal gate electrode problematic in the conventional art to about 0.4V or less. The fluctuation in threshold for each transistor can be reduced remarkably.

According to the manufacturing methods according to the second and third embodiments, when metal gate electrodes with different work functions are formed in the nMIS transistor and the pMIS transistor, after an electrode film suitable for one of the metal gate electrodes is formed on the whole surface, the work function of the electrode on the other region is controlled by ion implantation or thermal diffusion after film formation to be changed largely so that both the electrodes are optimized. Therefore, the number of steps in the embodiments is reduced as compared with the number of steps required in the case that films made of different metals are formed for the nMIS transistor and the pMIS transistor. Since the work function of the gate electrode for the PMIS transistor can be brought close to the upper limit of the valence band of silicon and the work function of the gate electrode for the nMIS transistor can be brought close to the lower limit of the conduction band of silicon, it is made easy to reduce the high threshold voltage of the metal gate electrode problematic in the conventional art to about 0.4V or less.

According to the manufacturing methods according to the second and third embodiments, since the work function can be controlled freely as compared with those of the metals used conventionally, it is unnecessary to produce an embedding-like channel using counter doping at all, which results in step simplification correspondingly.

In many cases, the metals used conventionally are uncongenial with the insulating film. However, the electrically conductive oxides according to the first embodiment of the present invention are congenial with the oxide or the oxynitrided insulating film, so that the range of the gate insulating films which can be used is remarkably expanded.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
an nMIS transistor including:
a first gate insulating film which is formed on a semiconductor substrate;
a first gate electrode formed on the first gate insulating film and including a first electrically conductive oxide film where a work function ϕm (eV) is in a range of 3.65≦ϕm≦4.45, the first electrically conductive oxide film comprising a Perovskite structure type oxide represented by ABO$_3$ or a Perovskite structure type oxynitride represented by ABON, where A is at least one element selected from an A1 or A2 group and B is at least one element selected from a B1 or B2 group, the A1 group being alkaline earth metals and rare earth metals, the A2 group being La and Y, the B1 group being Ti, Zr, Hf, and Ce, the B2 group being Ta, Nb, and V, and the first electrically conductive oxide film including at least one element selected from the A2 group or the B2 group; and
first source-drain regions formed on the semiconductor substrate on both sides of the first gate electrode; and
a pMIS transistor including:
a second gate insulating film formed on the semiconductor substrate;
a second gate electrode formed on the second gate insulating film and including a second electrically conductive oxide film where a work function φm (eV) is in a range of 4.77≦φm≦5.57, the second electrically conductive oxide film comprising a Perovskite structure type oxide of $CDO_3$ or a Perovskite structure type oxynitride represented by CDON, where C is at least one element selected from a C1 or C2 group and D is at least one element selected from a D1 or D2 group, the C1 group being alkaline earth metals and rare earth metals, the C2 group being La and Y, the D1 group being Ti, Zr, Hf, and Ce, the D2 group being W, Mo, Cr, Re, Tc, Mn, Os, Ru, Fe, Ir, Rh, Co, Pt, Pd, and Ni; and second source-drain regions formed on the semiconductor substrate on both sides of the second gate electrode.

2. A semiconductor device comprising:
an nMIS transistor including:
   a first gate insulating film which is formed on a semiconductor substrate;
   a first gate electrode formed on the first gate insulating film and including a first electrically conductive oxide film where a work function φm (eV) is in a range of 3.65≦φm≦4.45, the first electrically conductive oxide film comprising a Perovskite structure type oxide represented by $ABO_3$ or a Perovskite structure type oxynitride represented by ABON, where A is at least one element selected from an A1 or A2 group and B is at least one element selected from a B1 or B2 group, the A1 group being alkaline earth metals and rare earth metals, the A2 group being La and Y, the B1 group being Ti, Zr, Hf and Ce, the B2 group being Ta, Nb, and V, and the first electrically conductive oxide film including at least one element selected from the A2 group or the B2 group; and
   first source-drain regions formed on the semiconductor substrate on both sides of the first gate electrode; and
a pMIS transistor including:
   a second gate insulating film formed on the semiconductor substrate;
   a second gate electrode formed on the second gate insulating film and including a second electrically conductive oxide film where a work function φm (eV) is in a range of 4.77=φm≦5.57, the second electrically conductive oxide film comprising a rutile structure type oxide represented by $XO_2$ or a rutile structure type oxynitride represented by XON, where X includes at least one element selected from an X1 or X2 group groups, the X1 group being Ti, Zr, Hf, and Ce, the X2 group being W, Mo, Cr, Re, Tc, Mn, Os, Ru, Fe, Ir, Rh, Co, Pt, Pd, and Ni; and
   second source-drain regions formed on the semiconductor substrate on both sides of the second gate electrode.

3. A semiconductor device comprising:
an nMIS transistor including:
   a first gate insulating film which is formed on a semiconductor substrate;
   a first gate electrode formed on the first gate insulating film and including a first electrically conductive oxide film where a work function φm (eV) is in a range of 3.65≦φm≦4.45, the first electrically conductive oxide film comprising a rutile structure type oxide represented by $AO_2$ or a rutile structure type oxynitride represented by AON, where A includes at least one element selected from an A1 group and at least one element selected from an A2 group, the A1 group being Ti, Zr, Hf and Ce, and the A2 group being Ta, Nb, and V; and
   first source-drain regions formed on the semiconductor substrate on both sides of the first gate electrode; and
a pMIS transistor including:
   a second gate insulating film formed on the semiconductor substrate;
   a second gate electrode formed on the second gate insulating film and including a second electrically conductive oxide film where a work function φm (eV) is in a range of 4.77≦φm≦5.57, the second electrically conductive oxide film comprising a Perovskite structure type oxide represented by $CDO_3$ or a Perovskite structure type oxynitride represented by CDON, where C is at least one element selected from a C1 or C2 group and D is at least one element selected from a D1 or D2 group, the C1 group being alkaline earth metals and rare earth metals, the C2 group being La and Y, the D1 group being Ti, Zr, Ht and Ce, the D2 group being W, Mo, Cr, Re, Tc, Mn, Os, Ru, Fe, Ir, Rh, Co, Pt, Pd, and Ni; and
   second source-drain regions formed on the semiconductor substrate on both sides of the second gate electrode.

4. A semiconductor device comprising:
an nMIS transistor including:
   a first gate insulating film which is formed on a semiconductor substrate;
   a first gate electrode formed on the first gate insulating film and including a first electrically conductive oxide film where a work function φm (eV) is in a range of 3.65≦φm≦4.45, the first electrically conductive oxide film comprising a rutile structure type oxide represented by $AO_2$ or a rutile structure type oxynitride represented by AON, where A includes at least one element selected from an A1 group and at least one element selected from an A2 group, the A1 group being Ti, Zr, Hf, and Ce, and the A2 group being Ta, Nb, and V; and
   first source-drain regions formed on the semiconductor substrate on both sides of the first gate electrode; and
a pMIS transistor including:
   a second gate insulating film formed on the semiconductor substrate;
   a second gate electrode formed on the second gate insulating film and including a second electrically conductive oxide film where a work function φm (eV) is in a range of 4.77≦φm≦5.5, the second electrically conductive oxide film comprising a rutile structure type oxide represented by $XO_2$ or a rutile structure type oxynitride represented by XON, where X includes at least one element selected from an X1 or X2 group, the X1 group being Ti, Zr, Hf, and Ce, the X2 group being W, Mo, Cr, Re, Tc, Mn, Os, Ru, Fe, Ir, Rh, Co, Pt, Pd, and Ni; and
   second source-drain regions formed on the semiconductor substrate on both sides of the second gate electrode.

* * * * *